United States Patent [19]

Feldbaumer et al.

[11] Patent Number: 5,029,284
[45] Date of Patent: Jul. 2, 1991

[54] PRECISION SWITCHABLE BUS TERMINATOR CIRCUIT

[75] Inventors: David W. Feldbaumer, Chandler; Robert L. Vyne, Tempe, both of Ariz.

[73] Assignee: Motorola, Inc., Schaumburg, Ill.

[21] Appl. No.: 517,004

[22] Filed: Apr. 30, 1990

[51] Int. Cl.⁵ .......................................... H03H 11/28
[52] U.S. Cl. .................................. 307/443; 307/475; 357/59
[58] Field of Search .................. 307/443, 475; 357/51, 357/59 F

[56] References Cited

U.S. PATENT DOCUMENTS

| | | | |
|---|---|---|---|
| 4,748,426 | 5/1988 | Stewart | 333/22 R |
| 4,783,603 | 11/1988 | Goforth et al. | 307/475 |
| 4,792,920 | 12/1988 | Ogawa | 307/31 |
| 4,818,901 | 4/1989 | Young et al. | 307/443 |
| 4,859,877 | 8/1989 | Cooperman et al. | 307/443 |
| 4,881,902 | 11/1989 | Papa et al. | 333/22 R |
| 4,882,554 | 11/1989 | Akaba et al. | 333/22 R |

Primary Examiner—Stanley D. Miller
Assistant Examiner—Terry D. Cunningham
Attorney, Agent, or Firm—Michael D. Bingham

[57] ABSTRACT

An active integrated termination circuit for providing a predetermined impedance at an output includes first and second resistors each having one end of which is commonly connected to the output. A first switching element is coupled between the other end of the first resistor and a first power supply conductor and is responsive to control signals for selectively coupling and de-coupling the first resistor to the first power supply conductor. A second switching element is coupled between the other end of the second resistor and a second power supply conductor and is responsive to the control signals for selectively coupling and de-coupling the second resistor to the second power supply conductor. The first and second resistors are polycrystalline silicon resistors and are trimmed to predetermined values by pulsing a high current unilaterally therethrough.

14 Claims, 1 Drawing Sheet

PRECISION SWITCHABLE BUS TERMINATOR CIRCUIT

BACKGROUND OF THE INVENTION

The present invention relates to a circuit for terminating a bus line or network in a precision impedance and, more particularly, to providing termination for a small computer system interface (SCSI) to which SCSI peripheral devices are coupled through a cable bus in order to minimize line reflection.

There are many circuit applications comprised of a bus network or line in which the bus must be terminated in a proper "Thevenen" termination. For example, computers and computer peripheral devices such as printers, modems and the like can be networked or daisy chained together using a cable or bus connected to the respective SCSI outputs of the devices and the computers wherein all signals are common between the SCSI devices. In order to reduce or inhibit induced signal reflection onto the cable, it is important that both ends of the cable or bus be terminated in its characteristic impedance. Typically, two of the daisy chained SCSI devices in the network must present a matched termination impedance to the cable bus, those being the devices at the extreme ends of the bus network. In the industry, as set by the Accredited Standards Committee, this termination impedance is provided by a pair of resistors series coupled between a power supply conductor and logic ground with the interconnection therebetween being coupled to the output of the terminator circuit to the bus. The value of the resistors are specified to be 220 and 330 ohms respectively in order to provide an effective impedance of 132 ohms to closely match the characteristic impedance of the connecting cable.

Presently, most SCSI systems use a terminator network of discrete components which are made to be plugged into a socket of the terminating computer related device acting as the termination unit. To connect the termination network to a particular peripheral device, an appropriate resistor array is plugged into a provided socket. If no termination network is required in a particular device, the resistor array is either omitted or must be removed (if another device in the network already has a terminator circuit inserted therein). However, if the peripheral device including the terminator circuit is removed from the network then a remaining peripheral device must have a terminator circuit inserted therein to insure minimum line reflection. This need to manually insert and/or remove the resistor array network is highly undesirable.

Therefore, a need exists for providing a terminator circuit that can be permanently inserted in SCSI devices and which can be activated or deactivated by the device to either switch the circuit onto the bus or not respectively as required to provide the impedance matching.

In addition, it is desirable to fabricate such a terminator circuit in integrated circuit form while maintaining resistor tolerances to ±5%.

SUMMARY OF THE INVENTION

It is an object of the present invention to provide a precision switchable termination circuit.

It is another object of the present invention to provide an improved precision switchable bus terminator integrated circuit.

Still another object of the present invention is to provide an integrated switchable bus termination circuit having trimmable resistors to provide a controllable precision termination impedance and a method for trimming the resistors.

In accordance with the above and other objects there is provided a termination circuit having an output and comprising a pair of trimmable resistors each having a first end commonly connected to the output and a second end respectively coupled to a first or a second power supply conductor through a switching arrangement the magnitudes of the first and second resistors are trimmed to a predetermined value by pulsing current unilaterally therethrough to establish a predetermined resistance at the output.

In a first application the second ends of the resistors are coupled to respective trim terminals via oppositely poled diodes whereby applying a forward biasing potential between the output and the particular trim terminal the current pulses are unilaterally conducted through the trim resistors.

DETAILED DESCRIPTION OF THE PREFERRED EMBODIMENT

Figure 1:
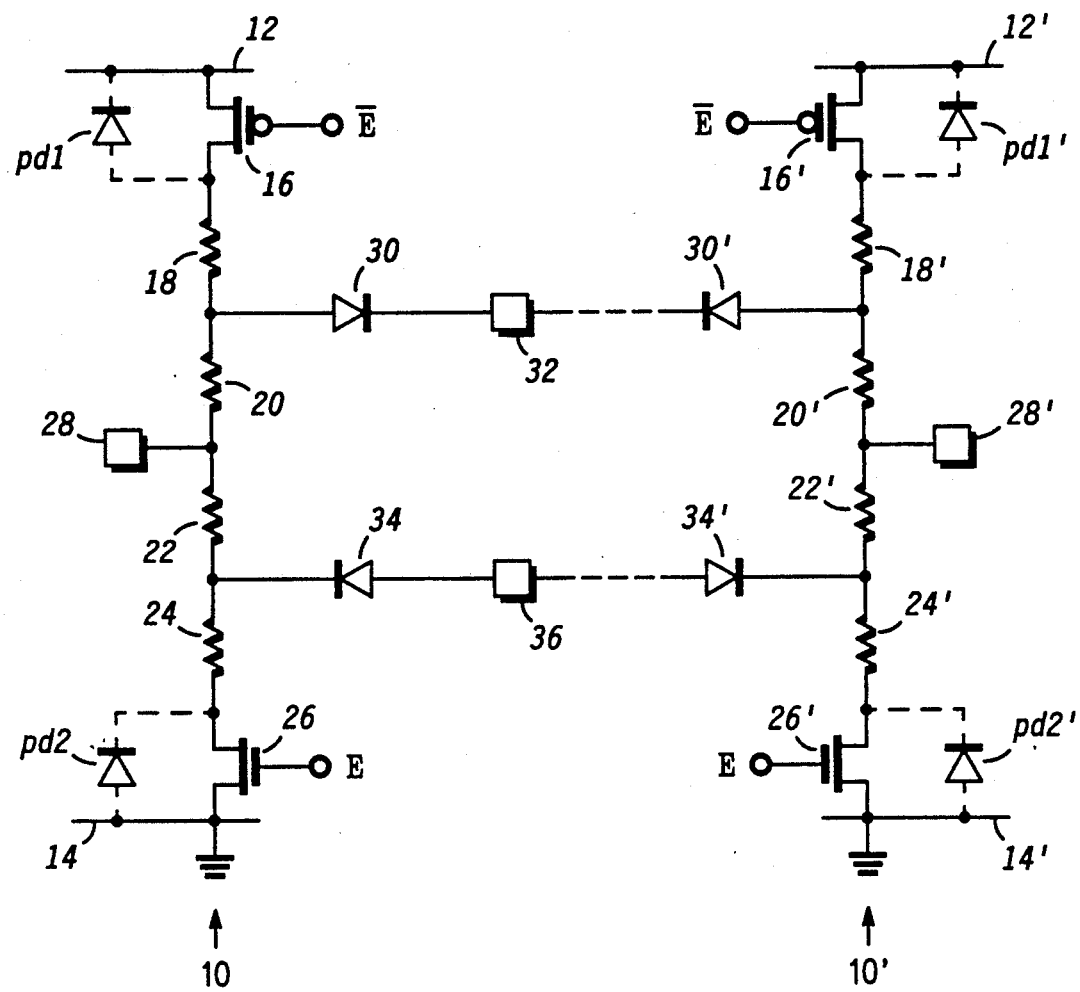
FIG. 1 is a schematic diagram illustrating the termination circuit of the present invention.

Turning to FIG. 1 there is shown termination circuit 10 of the present invention which is suitable to be fabricated in monolithic integrated circuit form. As illustrated, termination circuit 10 is a one bit terminator, i.e., it provides termination at the characteristic impedance of a bus line coupled to output 28 for one bit of signal information. Bus termination circuit 10 is coupled between power supply conductor 12 and ground 14 and includes PMOS field effect transistor 16 the source of which is coupled to conductor 12 and whose drain is coupled to precision resistor 18. Resistor 18 is coupled in series with resistors 20, 22, and precision resistor 24 to the drain of NMOS field effect transistor 26, the source of which is returned to logic ground 14. The interconnection between resistors 20 and 22 are connected to output terminal 28. A pair of diodes 30 and 34 are respectively coupled between trimming pads 32 and 36 and the interconnection between resistors 18, 20 and 22, 24. Similarly, multiple switching terminator circuits such as 10' may be provided for terminating other bus lines coupled thereto at 28' wherein the impedances of the multiple terminator circuits may be trimmed in accordance with the present invention using common trim pads 32 and 36. It is understood that like components of terminator circuit 10' with respect to terminator circuit 10 are designated by prime reference numerals.

If termination circuit 10 is to provide termination to a particular bus line connected thereto at output 28 complementary enabling switching signal E and $\overline{E}$ are applied to the gate electrodes of transistors 26 and 16 respectively thereby turning the transistors on and thereby selectively coupling or de-coupling the resistors between supply rail 12 and ground 14. When thus enabled, a first predetermined impedance is presented between supply rail 12 and output 28 to the coupled bus line while a second predetermined impedance is presented between ground and output 28. If, for example, termination circuit 10 is to be utilized in conjunction with a SCSI network, the industry has set the standard values of these two impedances to be 220 and 330 ohms respectively. Hence, the total impedance presented by the on resistance of transistor 16, and resistors 18 and 20 must be 220 ohms plus or minus a required tolerance percentage while that of transistor 26 and resistors 22 and 24 must be 330 ohms plus or minus a tolerance percentage. Typically, the respective impedance values are specified to have a ±5% tolerance.

Termination circuit 10 allows trimming of resistors 20 and 22 to compensate for process variations in the manufacture of the integrated circuit while precision resistors 18 and 24 are provided for off-setting the variations of the on-resistances of transistors 16 and 26 respectively due to process variations. In general, the resistors of termination circuit 10 are polycrystalline silicon resistor formed in the integrated circuit using conventional processing techniques. Trimming of polycrstalline silicon resistors is known and is accomplished by using short duration high current pulses. As current is pulsed through the resistor its resistance value decreases in a known manner. Thus, resistors 20 and 22 are made greater in value than needed so that in the fabrication of circuit 10 using conventional integrated circuit techniques it is ensured that the impedances between output 28 and supply and ground respectively are greater than 220 and 330 ohms. Therefore, the two resistors can be trimmed in production, for instance, after packaging of the circuit, to reduce the impedance thereof to meet industry standards. To trim resistor 20, common output 28 is brought to a higher potential than trim pad 32 while all other terminals and trim pads are left floating which diode isolates resistor 20 from any other bits coupled to trim pad 32. This forward biases diode 30 and permits pulsing current therethrough as well as resistor 20. Current pulses are applied until the resistance of resistor 20 is reduced to a value such that the total impedance between supply rail 12 and output 28 is the required value. Likewise, resistor 22 is trimmed by forward biasing diode 34 by applying a positive potential between trim pad 36 and output 28 and pulsing current through the resistor while all other terminals are left floating. In normal operation, trim pads 32 and 36 are tied to rails 12 and 14 respectively. Thus, by trimming the values of resistors 20 and 22, active switching termination circuit 10 provides an effective impedance of 132 ohms for matching to the characteristic impedance of the SCSI bus cable connected to output 28.

Dashing in diodes pd1, pd2, pd1' and pd2' are the parasitic drain diodes inherent in the fabrication of the FETs in integrated circuit form and are normally reverse bias during operation of termination circuit 10. It is possible to trim resistors 20 and 22 in the manner described above without the need of trim pads 32 and 36 and diodes 30 and 34 by taking advantage of these diodes. If resistor 18 is made wider than resistor 20 and resistor 24 is wider than resistor 22 and, if the magnitude of the current pulses is controlled, it is possible to trim resistor 20 or 22 without also trimming polycrystalline silicon resistors 18 and 24. For example, resistor 20 can be trimmed by raising the potential at output 28 with respect to supply rail 12 and pulsing current through the resistor. Similarly, by forward biasing pd2 resistor 24 may be trimmed. Likewise, the need for trim pads 32 and 36 may be eliminated by directly connecting the cathode of diode 30 and the anode of diode 34 to rails 12 and 14 respectively. Hence, by raising or reducing the potential applied at output 28 with respect to rail 12 or 14 respectively during test, either resistor 20 or 22 is trimmed in response to pulsing current therethrough.

Figure 2:
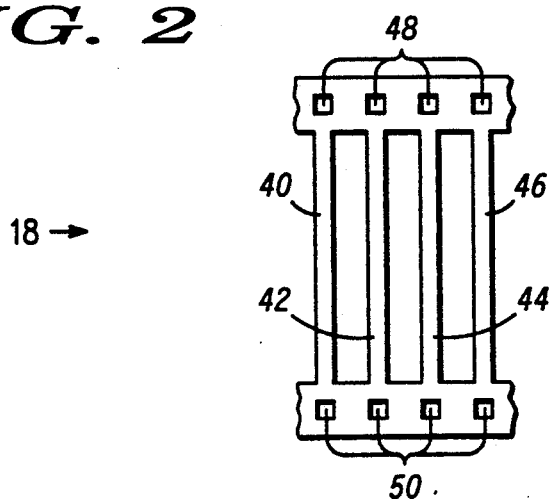
FIG. 2 is a layout diagram of a precision resistor used in the present invention.

Precision resistors 18 and 24 are provided to offset changes to the on resistance of the MOS transistors 16 and 26 due to process variations. Turning to FIG. 2, resistor 18, as is resistor 24, is shown to be a digitized resistor having multiple fingers 40, 42, 44, 46, etc. formed of polycrystalline silicon. Contact openings 48 and 50 are formed to interconnect resistor 18 between the drain of transistor 16 and resistor 20. If due to process variations in the manufacture of circuit 10 the channel length of transistor 16 is shortened the on-resistance thereof is reduced. However, the same process variation that causes shortening of the channel length will also cause the fingers of resistor 18 or 24 to become narrower. This causes the resistance of the resistors to increase. The layout and design of the resistor is such that it most perfectly offsets the change in the transistor on-resistance.

Hence, what has been described above is a precision switchable bus terminator that is useful to reduce reflected signals on the bus line by presenting a termination impedance that is matched to the characteristic impedance of the bus line coupled thereto. The switchable bus terminator can be fabricated in integrated circuit form and includes a pair of trimmable polycrystalline silicon resistors the resistance of which can be trimmed after packaging during test to provide a precision impedance at the output of the terminator.

What is claimed is:

1. A termination circuit having an output, comprising:

first and second power supply conductors;

first and second trimmable resistors each having a first end commonly coupled to the output and a second end;

means for selectively coupling and de-coupling said second ends of said first and second trimmable resistors respectively to said first and second power supply conductors;

first unilateral conducting means coupled between said second end of said first trimmable resistor and a first terminal for passing current pulses through said first trimmable resistor from said output to said first terminal to trim the resistance of said first trimmable resistor; and second unilateral conducting means coupled between said second end of said second trimmable resistor and a second terminal for passing current pulses through said second trimmable resistor from said second terminal to the output to trim the resistance of said second trimmable resistor.

2. The termination circuit of claim 1 wherein said means for selectively coupling and de-coupling includes:

a first transistor having first, second and control electrodes, said first electrode being coupled to said first power supply conductor, said second electrode being coupled to said second end of said first trimmable resistor;

a second transistor having first, second and control electrodes, said first electrode being coupled to said second end of said second trimmable resistor and said second electrode being coupled to said second power supply conductor; and said first and second transistors being responsive to control signals being applied to the respective control electrodes thereof for coupling or de-coupling said first and second trimmable resistors between said first and second power supply conductors.

3. The termination circuit of claim 2 wherein said first and second trimmable resistors are polycrystalline silicon resistors.

4. The termination circuit of claim 3 wherein said first and second transistors are complementary MOS transistors.

5. The termination circuit of claim 4 including first and second precision resistors for offsetting changes in the on-resistances of said first and second MOS transistors, said first precision resistor being coupled between said second electrode of said first transistor and said second end of said first trimmable resistor and said second precision resistor being coupled between said second end of said second trimmable resistor and said first electrode of said second transistor.

6. An integrated termination circuit for selectively providing a predetermined impedance at an output, comprising:
  first and second power supply conductors;
  first and second trimmable resistors each having a first and second end, said first ends being coupled to the output;
  switching means responsive to control signals applied thereto for selectively coupling and de-coupling said respective second ends of said first and second trimmable resistors to said first and second power supply conductors;
  first unilateral conducting means coupled to said second end of said first trimmable resistor for passing high current pulses through said first trimmable resistor such that the resistance thereof is trimmed to a predetermined value; and
  second unilateral conducting means coupled to said second end of said second trimmable resistor for passing high current pulses through said second trimmable resistor such that the resistance thereof is trimmed to a predetermined value.

7. The termination circuit of claim 6 wherein said switching means includes;
  a first transistor of a first conductivity type having first, second and control electrodes, said first electrode being coupled to said first power supply conductor, said second electrode being coupled to said second end of said first trimmable resistor and said control electrode receiving said control signals; and
  a second transistor of a second conductivity type having first, second and control electrodes, said first electrode being coupled to said second end of said second trimmable resistor, said second electrode being coupled to said second power supply conductor and said control electrode receiving said control signals.

8. The termination circuit of claim 7 wherein said first and second transistors are formed in the integrated circuit and are PMOS and NMOS field effect transistors respectively and said first, second and control electrodes are the source, drain and gate of the respective transistors.

9. The termination circuit of claim 8 wherein said first unilateral conducting means includes a first diode coupled between said second end of said first trimmable resistor and a first terminal for passing said high current pulses from said output through said first trimmable resistor to said first terminal responsive to a predetermined potential of a first polarity being applied across the output and said first terminal while said first and second power supply conductors are left floating.

10. The termination circuit of claim 9 wherein said second unilateral conducting means includes a second diode coupled between said second end of said second trimmable resistor and a second terminal for passing said high current pulses from said second terminal through said second trimmable resistor to output responsive to a predetermined potential of a second polarity being applied across the output and said second terminal while said first and second power supply conductors are left floating.

11. The termination circuit of claim 10 including first and second precision resistors, said first precision resistor being coupled between said second electrode of said first transistor and said second end of said first trimmable resistor and said second precision resistor being coupled between said first end of said second transistor and said second end of said second trimmable resistor.

12. The termination circuit of claim 8 wherein said first unilateral conducting means comprises the parasitic drain diode formed between said drain of said first transistor and said first power supply conductor and said second unilateral conducting means comprises the parasitic drain diode formed between said drain of said second transistor and said second power supply conductor.

13. The termination circuit of claim 12 including first and second precision resistors, said first precision resistor being coupled between said second electrode of said first transistor and said second end of said first trimmable resistor and said second precision resistor being coupled between said first end of said second transistor and said second end of said second trimmable resistor.

14. A method for providing an integrated precision active terminator circuit having an output and a pair of resistors one end of which are commonly coupled to the output and the other ends of which are respectively coupled and de-coupled between first and second power supply conductors, comprising the steps of:
  forming the pair of resistors of polycrstalline silicon;
  pulsing a high current unilaterally through the first resistor to trim the resistance thereof to a first predetermined value; and
  pulsing a high current unilaterally through the second resistor to trim the resistance thereof to a second predetermined value.

* * * * *